(12) United States Patent
Ieong et al.

(10) Patent No.: US 7,759,772 B2
(45) Date of Patent: Jul. 20, 2010

(54) METHOD TO FORM SI-CONTAINING SOI AND UNDERLYING SUBSTRATE WITH DIFFERENT ORIENTATIONS

(75) Inventors: Meikei Ieong, Wappingers Falls, NY (US); Devendra K. Sadana, Pleasantville, NY (US); Ghavam Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 836 days.

(21) Appl. No.: 11/550,681

(22) Filed: Oct. 18, 2006

(65) Prior Publication Data

US 2008/0128866 A1    Jun. 5, 2008

Related U.S. Application Data

(62) Division of application No. 10/992,150, filed on Nov. 18, 2004, now Pat. No. 7,141,457.

(51) Int. Cl.
*H01L 29/04* (2006.01)
*H01L 31/036* (2006.01)

(52) U.S. Cl. .................... 257/627; 257/628; 438/455

(58) Field of Classification Search ............... 257/627, 257/628, E21.122, E21.567; 438/143, 150, 438/455, 486
See application file for complete search history.

(56) References Cited

U.S. PATENT DOCUMENTS

| | | | |
|---|---|---|---|
| 6,531,375 B1 | 3/2003 | Giewont et al. | |
| 7,291,886 B2 * | 11/2007 | Doris et al. | 257/350 |
| 7,294,898 B2 * | 11/2007 | Snyder et al. | 257/453 |
| 2004/0061200 A1 | 4/2004 | Iwamatsu et al. | |
| 2004/0079993 A1 * | 4/2004 | Ning et al. | 257/347 |
| 2005/0280121 A1 | 12/2005 | Doris et al. | |

* cited by examiner

*Primary Examiner*—Phuc T Dang
(74) *Attorney, Agent, or Firm*—Scully, Scott, Murphy & Presser, P.C.; Louis J. Percello, Esq.

(57) ABSTRACT

A method of forming a hybrid SOI substrate comprising an upper Si-containing layer and a lower Si-containing layer, wherein the upper Si-containing layer and the lower Si-containing layer have different crystallographic orientations. In accordance with the present invention, the buried insulating region may be located within one of the Si-containing layers or through an interface located between the two Si-containing layers.

16 Claims, 6 Drawing Sheets

FIG.6 ical to be described, for example, in U.S. application Ser. No. 10/250,241, Jun. 17, 2003. The '241 application discloses that one of the semiconductor layers may be from a prefabricated SOI substrate. In such a case, the prefabricated SOI wafer is bonded to another wafer that can also include a prefabricated SOI wafer.
METHOD TO FORM SI-CONTAINING SOI AND UNDERLYING SUBSTRATE WITH DIFFERENT ORIENTATIONS

RELATED APPLICATIONS

This application is a divisional of U.S. application Ser. No. 10/992,150, filed Nov. 18, 2004, now U.S. Pat. No. 7,141,457.

FIELD OF THE INVENTION

The present invention relates to a method of fabricating a semiconductor material, and more particular to a method of fabricating a silicon-on-insulator (SOI) material wherein an upper Si-containing layer of the SOI material has a different crystallographic orientation than a lower semiconductor substrate layer. A buried insulating region (continuous or non-continuous) can be present in either one of the Si-containing layers or through an interface that is located between the two Si-containing layers.

BACKGROUND OF THE INVENTION

In present semiconductor technology, CMOS devices such as nFETs or pFETs are typically fabricated on semiconductor wafers, such as Si, that have a single crystal orientation. In particular, most of today's semiconductor devices are built upon Si having a (100) crystal orientation.

Electrons are known to have a high mobility for a (100) Si surface orientation, but holes are known to have a higher mobility for a (110) Si surface orientation. That is, hole mobility values on (100) Si are roughly 2×-4× lower than the corresponding electron mobility for this crystallographic orientation. To compensate for this discrepancy, pFETs are typically designed with larger widths in order to balance pull-up currents against the nFET pull-down currents and achieve uniform circuit switching. pFETS having larger widths are undesirable since they take up a significant amount of chip area.

In contrast to the foregoing, hole mobilities on (110) Si are 2× higher than on (100) Si; therefore, pFETS formed on a (110) Si surface will exhibit significantly higher drive currents than pFETs formed on a (100) Si surface. Unfortunately, electron mobilities on (110) Si surfaces are significantly degraded compared to (100) Si surfaces.

As can be deduced from the above discussion, the (110) Si surface is optimal for pFET devices because of the excellent hole mobility, yet such a crystal orientation is completely inappropriate for nFET devices. Instead, the (100) Si surface is optimal for nFET devices since that crystal orientation favors electron mobility.

Methods have been described to form planar hybrid substrates with different surface orientations through wafer bonding. In such endeavors, the planar hybrid substrate is obtained mainly through semiconductor-to-insulator, or insulator-to-insulator wafer bonding to achieve pFETs and nFETs on their own optimized crystal orientation for high performance device manufacture. However, at least one type of MOSFET (either pFETs or nFETs) is on an SOI material, while the other type of MOSFET is either on a bulk semiconductor or an SOI with a thicker SOI film.

Recently, hybrid crystal oriented substrates have been prepared using a method that includes providing a bonded substrate comprising at least a top semiconductor layer of a first crystallographic orientation and a bottom semiconductor layer of a second crystallographic orientation that differs from the first crystallographic orientation; protecting a portion of the bonded substrate providing a first region, while leaving another portion of the bonded substrate unprotected providing a second region; etching the unprotected portion of the bonded substrate to expose the bottom semiconductor layer; regrowing a semiconductor material on the bottom semiconductor layer such that the semiconductor material has the second crystallographic orientation; and planarizing. Such a technique is described, for example, in U.S. application Ser. No. 10/250,241, Jun. 17, 2003. The '241 application discloses that one of the semiconductor layers may be from a prefabricated SOI substrate. In such a case, the prefabricated SOI wafer is bonded to another wafer that can also include a prefabricated SOI wafer.

Although the above technique is feasible, there is no freedom as to where the buried insulating layer will be present in such instances.

In view of the above, there is a need for providing a method of fabricating a SOI substrate material in which the SOI layer of the SOI material has a different crystal orientation than the underlying Si-containing layer and wherein the buried insulating region is formed after bonding. By forming the buried insulating region after bonding, it is possible to provide a hybrid SOI substrate in which the buried insulating region can exist within different regions of the hybrid SOI substrate. The term "hybrid SOI substrate" denotes a substrate material that includes an upper Si-containing layer and a lower Si-containing layer of different crystallographic orientations, wherein a buried insulating region is located in at least one of the Si-containing layers or through an interface located therebetween.

SUMMARY OF THE INVENTION

The present invention provides a method of forming a hybrid SOI substrate comprising an upper Si-containing layer and a lower Si-containing layer, wherein the upper Si-containing layer and said lower Si-containing layer have different crystallographic orientations. In accordance with the present invention, the buried insulating region may be located within one of the Si-containing layers or through an interface located between the two Si-containing layers.

Specifically, and in broad terms, the method of the present invention includes the steps of:

providing a stack comprising an upper Si-containing layer of a first crystallographic orientation and a lower Si-containing layer of second crystallographic orientation, wherein said first crystallographic orientation is different from said second crystallographic orientation;

implanting ions into said stack to create an ion rich implant region therein; and heating said stack to a temperature that causes ions within the ion rich implant region to precipitate forming a buried insulating region within said stack.

In one embodiment of the present invention, the ions are implanted predominately within the upper Si-containing layer such that after heating a buried insulating region forms mainly within the upper Si-containing layer. In another embodiment, the ions are implanted predominately within the lower Si-containing layer such that after heating a buried insulating region forms mainly within the lower Si-containing layer. In yet another embodiment, the ions are implant in such a fashion such that the resultant buried insulating region is formed through an interface between the upper Si-containing layer and the lower Si-containing layer.

The implanting step may be a blanket implant such that the buried insulating region formed is present continuously throughout the entire length of the stack. In another embodiment of the present invention, a masked implant step is used so as to form discrete and isolated (i.e., non continuous or patterned) buried insulating regions within the stack.

The ions that can be implanted include, oxygen ions, nitrogen ions, NO ions, inert gases or mixtures thereof. In one embodiment, it is preferred to implant oxygen ions thereby forming a buried oxide (BOX) within the stack.

In addition to the above-described method, the present invention also relates to a hybrid SOI substrate material that can be formed by the inventive process. Specifically, and in broad terms, the inventive hybrid SOI substrate material comprises:

an upper Si-containing layer and a lower Si-containing lower of different crystallographic orientations, wherein a buried insulating region is located in at least one of the Si-containing layers or through an interface located therebetween.

DETAILED DESCRIPTION OF THE INVENTION

The present invention, which provides a method of fabricating a hybrid SOI substrate material as well as the hybrid SOI substrate material itself, will now be described in greater detail by referring to the drawings that accompany the present application. It is noted that in the accompanying drawings, like and corresponding elements are referred to by like reference numerals. Moreover, it is observed that the drawings are provided for illustrative proposes and thus they are not drawn to scale.

Figure 1A:
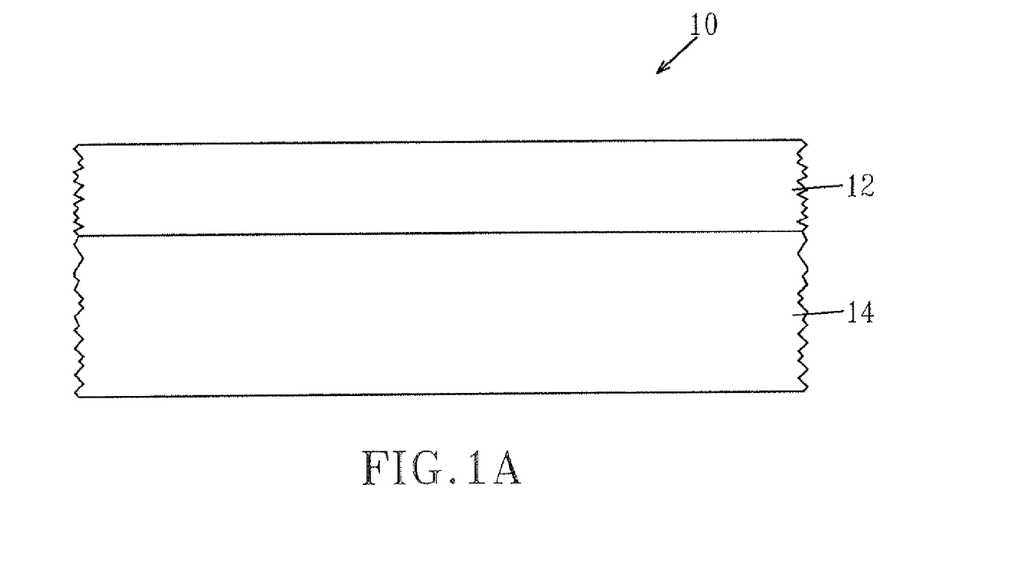
FIGS. 1A-1C are pictorial representations (through cross-sectional views) illustrating the various processing steps of one embodiment of the present invention for fabricating a hybrid SOI substrate, wherein the buried insulating region is continuous and is present within the upper Si-containing layer.
Figure 1B:
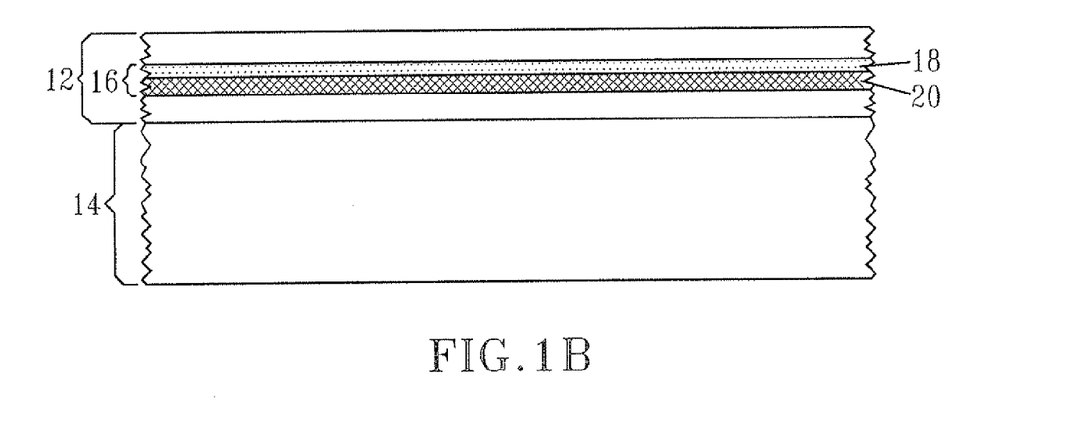
Figure 1C:
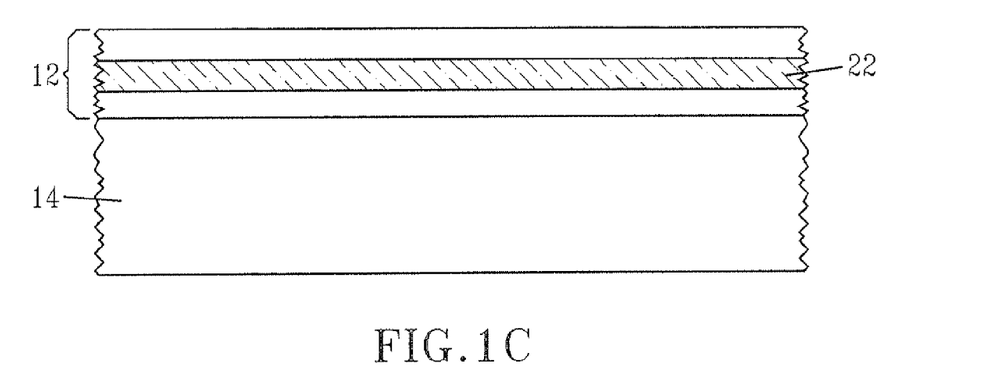

FIGS. 1A-1C, which are pictorial representations (through cross-sectional views) illustrating the various processing steps of one embodiment of the present invention for fabricating a hybrid SOI substrate, wherein the buried insulating region is continuous and is present within the upper Si-containing layer, will now be described in greater detail.

Reference is first made to FIG. 1A which illustrates a stack 10 that includes an upper Si-containing layer 12 having a first crystallographic orientation and a lower Si-containing layer 14 having a second crystallographic orientation wherein the first crystallographic orientation is different from the second crystallographic orientation.

In the present invention, the term "Si-containing layer" denotes a semiconductor material that includes silicon. Illustrative examples of such silicon containing semiconductor materials include Si, SiGe, SiC, SiGeC, performed silicon-on-insulators, preformed silicon germanium-on-insulators or layered structures such as Si/SiGe. The Si-containing layers 12 and 14 may comprise the same or different silicon containing semiconductor material. Typically, the Si-containing layers 12 and 14 are both comprised of Si. In some embodiments, at least the upper Si-containing layer 12 is isotopically pure, i.e., $Si^{28}$ or $Si^{28}Ge^{74}$.

The thickness of the upper Si-containing layer 12 may vary depending on the desired use of the hybrid SOI substrate. Typically, however, the upper Si-containing layer 12 has a thickness from about 5 to about 500 nm, with a thickness from about 5 to about 100 nm being more typical. Note that the thickness range for the upper Si-containing layer 12 is determined after bonding and any optional thinning step that may be performed.

The thickness of the lower Si-containing layer 14 is not critical. Typically, however the thickness of the lower Si-containing layer 14 is generally greater than that of the upper Si-containing layer 12 after subjecting the upper Si-containing layer 12 to thinning.

The first and second crystallographic orientations of the Si-containing layers 12 and 14, respectively, may include any major or minor axes of a Si-containing layer. For example, the Si-containing layers can have a (100), (111), (110), (422), (311), (521) or etc. crystal orientation. Preferably, the Si-containing layers 12 and 14 are selected from those that include a major Miller index such as (100), (111) or (110).

The stack 10 shown in FIG. 1A is formed by selecting a first wafer that includes the upper Si-containing layer 12 and a second wafer that includes the lower Si-containing layer 14 and then bonding the two wafers together. In some embodiments, hydrogen or another like ion can be introduced into the upper Si-containing layer 12 prior to bonding. The presence of hydrogen or another like ion within the upper Si-containing layer 12 can be used to split a portion of the upper Si-containing layer 12 so as to provide a thinner upper Si-containing layer.

After selecting the first and second wafers, the two selected wafers are then bonded by first bringing the wafers into intimate contact with each other, optionally applying an external force, and then annealing the two contacted wafers, with or without the application of the external force, under conditions that are capable of bonding the two selected wafers. The annealing step used for bonding is typically performed at nominal room temperature which is typically from about 15° to about 40° C. In yet another embodiment of the present invention, temperatures up to 400° C. can be used in the bonding of the two wafers.

After bonding, the wafers are typically further annealed to enhance the bonding strength and improve the interface property. The further annealing step is typically carried out at a temperature from about 900° to about 1400° C., with an annealing temperature from about 1000° to about 1100° C.

being more typical. The bond strengthen annealing is performed within the aforementioned temperature ranges for various time periods that may range from about 1 hour to about 24 hours. The bond strengthen annealing ambient can be $O_2$, $N_2$, Ar, or a low vacuum, with or without external adhesive forces. Mixtures of the aforementioned annealing ambients, with or without an inert gas, are also contemplated herein.

Although high-temperature annealing (as described above) is often used for bond strengthen, it is also possible to use a low temperature anneal (less than 900° C.) which can also achieve good mechanical and electrical properties.

It should be noted that the bond strengthen annealing step that follows the direct semiconductor-to-semiconductor bonding step can be performed at a single temperature using a specific ramp-up rate, or it can be performed using various temperatures in which various ramp-up rates and soak cycles are employed.

To obtain a certain predetermined thickness of the upper Si-containing layer 12, various thinning techniques can be used in the present invention. One direct and simple approach that can be used in the present invention is to use wafer grinding, polishing or an etch back process. Thinning can also be achieved by a gaseous reaction such as a hydrogen bake.

Another means to thin the upper Si-containing layer 12 is applicable to embodiments where the initial wafer comprising the upper Si-containing layer 12 includes an ion implant region. In this case, the ion implant region forms a porous region during the bonding process which causes a portion of the wafer above the ion implant region to break off leaving a bonded wafer such as is shown, for example, in FIG. 1A. As stated above, the implant region is typically comprised of hydrogen ions that are implanted into the surface of the wafer including the upper Si-containing layer 12 utilizing ion implantation conditions that are well known to those skilled in the art. After bonding, another heating step is typically performed in an inert ambient at a temperature from about 100° to about 400° C. for a time period from about 2 to about 30 hours to increase the bonding energy. More preferably, this other heating step is performed at a temperature from about 200° to about 300° C. for a time period from about 2 to about 20 hours. The term "inert ambient" is used in the present invention to denote an atmosphere in which an inert gas, such as He, Ar, $N_2$, Xe, Kr or a mixture thereof, is employed. A preferred ambient used during the bonding process is $N_2$. The layer splitting at the implant region will take place during a 350°-500° C. annealing afterwards. In yet another embodiment of the present invention, ions such as hydrogen can be implanted into the bonded wafers and used as a mark for stopping a planarization process.

Next, ions are implanted into the stack 10 to provide an ion rich implant region within the stack 10 that has a sufficient ion concentration such that during a subsequent heating step the ions precipitate forming a buried insulating region within the stack 10. Typically, the implanted ions for an ion rich implant region within the stack 10 that has an ion concentration of about $1\times10^{22}$ atoms/cm$^3$ or greater.

The ions employed in this step of the present invention are capable of forming a buried insulating region when subjected to a subsequent heating step. Illustrative examples of such ions include, but are not limited to: oxygen ions, nitrogen ions, NO ions, inert gases or mixtures thereof. Preferably, oxygen ions are implanted into the stack 10 at this point of the present invention.

The ions are implanted into the stack 10 using SIMOX processes and conditions that are well known to those skilled in the art, as well as the various SIMOX processes and conditions mentioned in co-assigned U.S. Patent Application Publication Nos. 20020190318 and 20020173114, and U.S. Pat. Nos. 5,930,634, 6,486,037, 6,541,356 and 6,602,757, the entire contents of each are being incorporated herein by reference. The implant may be a blanket implant as illustrated in this embodiment, or a patterned implant, as illustrated in other embodiments of the present invention, can be used. See, for example, FIGS. 3A-5B. The patterned implant may include a mask formed directly on the surface of the upper Si-containing layer 12 or a mask that is located some distance from the surface of the upper Si-containing layer 12 may be employed.

Although various implant conditions can be employed in the present invention, the following provides general implant conditions for forming an implanted ion rich region predominately within the upper Si-containing layer 12:

I. High-dose ion implantation: The term "high-dose" as used herein denotes an ion dosage of about 4E17 cm$^{-2}$ or greater, with an ion dosage from about 4E17 to about 2E18 cm$^{-2}$ being more preferred. In addition to using high-ion dosage, this implant is typically carried out in an ion implantation apparatus that operates at a beam current density from about 0.05 to about 500 milliamps cm$^{-2}$ and at an energy from about 40 to about 240 keV.

This implant, which may be referred to as a base ion implant, is carried out at a temperature from about 200° C. to about 800° C. at a beam current density from about 0.05 to about 500 mA cm$^{-2}$. More preferably, the base ion implant may be carried out at a temperature from about 200° C. to about 600° C. at a beam current density from about 5 to about 10 mA cm$^{-2}$.

If desired, the base ion implant step may be followed by a second oxygen implant that is carried out using an ion dose from about 1E14 to about 1E16 cm$^{-2}$, with an ion dose from about 1E15 to about 4E15 cm$^{-2}$ being more highly preferred. The second ion implant is carried out at an energy of from about 60 keV or greater.

This second implant is performed at a temperature from about 4K to about 200° C. with a beam current density from about 0.05 to about 10 mA cm$^{-2}$. More preferably, the second ion implant may be performed at a temperature from about 25° C. to about 100° C. with a beam current density from about 0.5 to about 5.0 mA cm$^{-2}$.

Note that the second ion implant forms an amorphous region that is shallower the damaged region caused by the base ion implant step; See, for example, FIG. 1B. During the subsequent heating step of the present invention, the amorphous and damaged region become part of the buried insulating region; See, for example FIG. 1C.

II. Low-dose ion implant: The term "low-dose" as used herein for this embodiment of the present invention denotes an ion dose of about 4E17 cm$^{-2}$ or less, with an ion dose from about 1E16 to about 3.9E17 cm$^{-2}$ being more preferred. This low-dose implant is performed at an energy from about 40 to about 240 keV.

This implant, which may be referred to as a base ion implant, is carried out at a temperature from about 100° C. to about 800° C. More preferably, the base ion implant may be carried out at a temperature from about 200° C. to about 650° C. with a beam current density from about 0.05 to about 500 mA cm$^{-2}$.

The low-dose base implant step is preferably followed by a second ion implant that is carried out using the conditions mentioned above.

It is again emphasized that the above types of implant conditions are exemplary and by no way limit the scope of the present invention. Instead, the present invention contemplates all conventional ion implants that are typically employed in conventional SIMOX processes.

In a preferred embodiment of the present invention in which the ion rich implant region is formed into the upper Si-containing layer 12 of the stack 10, a low-dose oxygen ion implant step is performed using a base ion implant step and a second ion implant step, as described above.

Using a base ion implant followed by the second ion implant step provides a structure such as shown in FIG. 1B that includes an ion rich implant region 16 that comprises an amorphous region 18 that is shallower than a damaged region 20 created by the optimal base oxygen implant step.

It is noted that the low-dose implant regime is preferred over the high-dose implant regime since the low-dose regime provides a high quality thermal insulating region, e.g., thermal oxide. In the case where optimal conditions are employed, the diffusion barrier is a buried oxide having a mini-breakdown electric field of about 6 MV/cm or more.

After implanting the ions with the stack 10, the stack 10 including the ion rich implant region is then subjected to a heating step that causes precipitation of the implantation ions and subsequent formation of a buried insulating region. FIG. 1C shows the hybrid SOI substrate material that is formed after performing the heating step. In this drawing, reference numeral 22 denotes the buried insulating region. Note that a surface oxide layer, not shown, is typically formed atop the upper Si-containing layer 12 during the heating step. This surface oxide layer is typically, but not always, removed from the structure after the heating step using a conventional wet etch process wherein a chemical etchant such as HF that has a high selectivity for removing oxide as compared to a Si-containing material is employed. The surface oxide layer formed after the heating step of the present invention has a variable thickness which may range from about 10 to about 1400 nm, with a thickness from about 100 to about 900 nm being more typical.

The buried insulating region 22 formed also has a variable thickness which is dependent upon the concentration of ions within the ion rich implant region as well as the conditions used during the heating step. Typically, the buried insulating region 22 has a thickness ranging from about 400 nm or less, with a thickness from about 50 to about 200 nm being more typical.

Specifically, the heating step of the present invention is an annealing step that is typically performed at a high temperature from about 900° C. to about 1350° C., with a temperature from about 1200° C. to about 1335° C. being more typical. Moreover, the heating step of the present invention is carried out in an oxidizing ambient which includes at least one oxygen-containing gas such as $O_2$, NO, $N_2O$, ozone, air or other like oxygen-containing gases. The oxygen-containing gas may be admixed with each other (such as an admixture of $O_2$ and NO), or the gas may be diluted with an inert gas such as He, Ar, $N_2$, Xe, Kr, or Ne. In some embodiments, a chlorine-containing ambient such as trichloroethane (TCA) can be used in conjunction with the oxygen-containing ambient and optionally the inert gas. When TCA is used it typically is present in an amount from about 0.0001 to about 0.05%. An inert gas can be used alone in the final cool down of the heated stack 10.

The heating step may be carried out for a variable period of time that typically ranges from about 10 to about 6000 minutes, with a time period from about 60 to about 3000 minutes being more typical. The heating step may be carried out at a single targeted temperature, or various ramp and soak cycles using various ramp rates and soak times can be employed.

Figure 6:
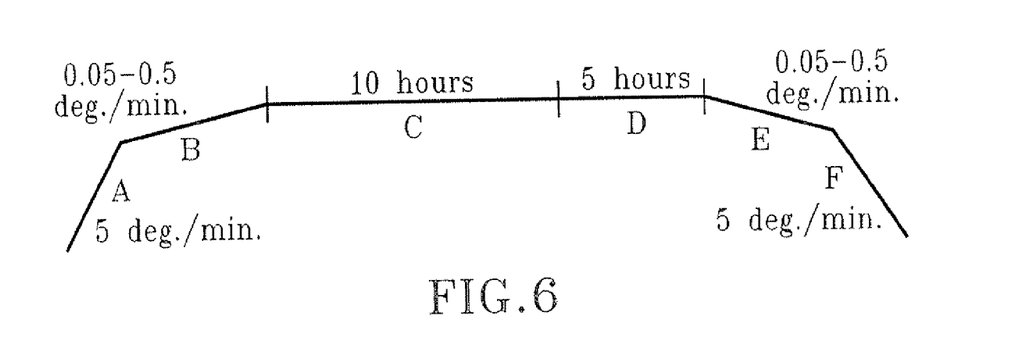
FIG. 6 is a schematic illustrating one possible thermal anneal cycle that can be used in the present invention.

FIG. 6 is a schematic illustrating one possible thermal anneal cycle that can be used in the present invention. The illustrated thermal anneal cycle includes an initial first ramp up A) from 600° C. to 1000° C. at 5° C./min in 5% oxygen (Ar dilution), followed by an initial second ramp up from 1000° C. to 1150° C. at 5° C./min in 5% oxygen (Ar+1.45×10$^{-4}$% TCA dilution), B) ramp up from 1150° C. to 1300° C. at 0.1° C./min in 5% oxygen (Ar+1.45×10$^{-4}$% TCA dilution), C) soak at 1320° C. for 5-10 hours in 50% oxygen (Ar dilution); D) soak at 1320° C. for 0-5 hours in 4% oxygen (Ar+1.45× 10$^{-4}$% TCA dilution), E) cool down from 1320° C. to 1150° C. in same ambient as in step D), and F) cool down from 1150° C. to 600° C. in $N_2$.

The above discussion illustrates one embodiment of the present invention in which the buried insulating region 22 is continuous and it is formed within the upper Si-containing layer 12 of the stack 10. As shown in FIG. 1C, a portion of the lower Si-containing layer 14 is located below the surface of the buried insulating region 22.

Figure 2A:
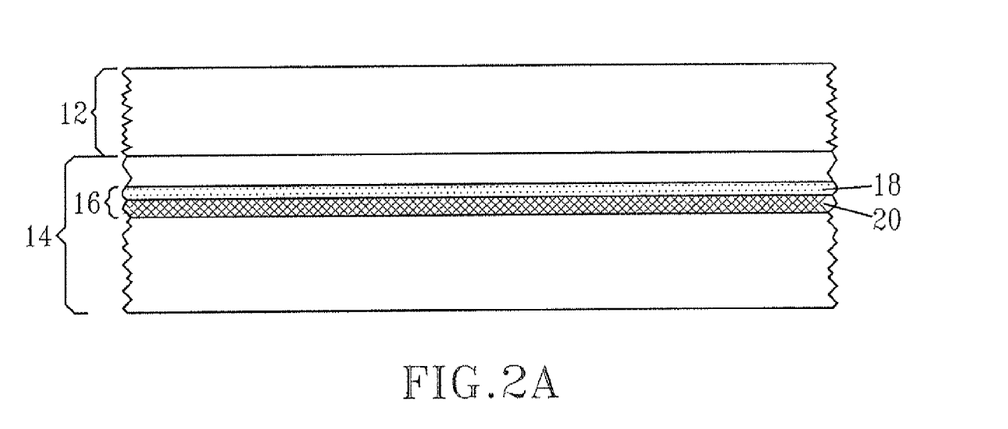
FIGS. 2A-2B are pictorial representations (through cross-sectional views) illustrating the various processing steps of one embodiment of the present invention for fabricating a hybrid SOI substrate, wherein the buried insulating region is continuous and is present within the lower Si-containing layer.
Figure 2B:
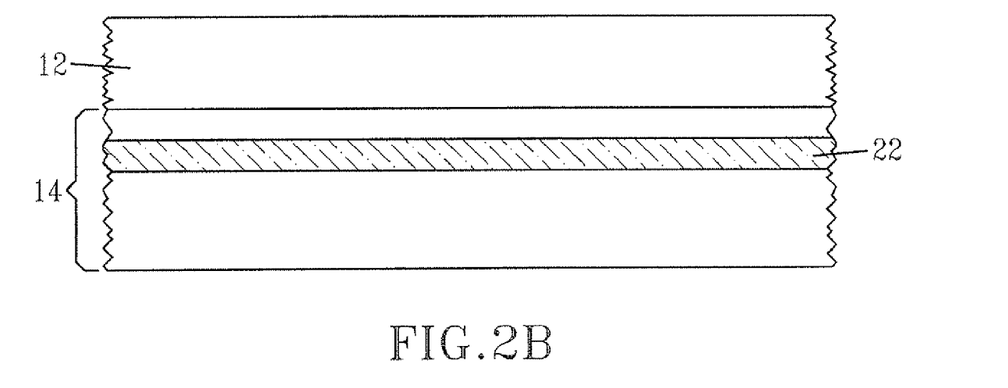

FIGS. 2A-2B illustrate a second embodiment in which a continuous buried insulating region 22 is formed within the lower Si-containing layer 14 of the stack 10. This embodiment of the present invention begins with first providing the stack 10 shown in FIG. 1A. Unlike the embodiment depicted above, the implant conditions are altered such that the majority of the ion rich implant region 16 (including the optional amorphous region 18 and damaged region 20) are formed within the lower Si-containing layer 14. See FIG. 2A, for example.

The ions are implanted into stack 10 using SIMOX processes and conditions that are well known to those skilled in the art, as well as the various SIMOX processes and conditions mentioned in co-assigned references mentioned above. Although various implant conditions can be employed in the present invention, the following provides general implant conditions for forming an implanted ion rich region predominately within the lower Si-containing layer 14:

I. High-dose ion implantation: The term "high-dose" as used herein denotes an 2E18 cm$^{-2}$ being more preferred. In addition to using high-ion dosage, this implant is typically carried out in an ion implantation apparatus that operates at a beam current density from about 0.05 to about 500 milliamps cm$^{-2}$ and at an energy from about 40 to about 240 keV.

This implant, which may be referred to as a base ion implant, is carried out at a temperature from about 200° C. to about 800° C. at a beam current density from about 0.05 to about 500 mA cm$^{-2}$. More preferably, the base ion implant may be carried out at a temperature from about 200° C. to about 600° C. at a beam current density from about 5 to about 10 mA cm$^{-2}$.

If desired, the base ion implant step may be followed by a second oxygen implant that is carried out using an ion dose from about 1E14 to about 1E16 cm$^{-2}$, with an ion dose from about 1E15 to about 4E15 cm$^{-2}$ being more highly preferred. The second ion implant is carried out at an energy of from about 60 keV or greater.

This second implant is performed at a temperature from about 4K to about 200° C. with a beam current density from about 0.05 to about 10 mA cm$^{-2}$. More preferably, the second ion implant may be performed at a temperature from about 25° C. to about 100° C. with a beam current density from about 0.5 to about 5.0 mA cm$^{-2}$.

Note that the second ion implant forms an amorphous region that is shallower the damaged region caused by the base ion implant step. During the subsequent heating step of the present invention, the amorphous and damaged region become part of the buried insulating region.

II. Low-dose ion implant: The term "low-dose" as used herein for this embodiment of the present invention denotes an ion dose of about 4E17 cm$^{-2}$ or less, with an ion dose from about 1E16 to about 3.9E17 cm$^{-2}$ being more preferred. This low-dose implant is performed at an energy from about 40 to about 240 keV.

This implant, which may be referred to as a base ion implant, is carried out at a temperature from about 100° C. to about 800° C. More preferably, the base ion implant may be carried out at a temperature from about 200° C. to about 650° C. with a beam current density from about 0.05 to about 500 mA cm$^{-2}$.

The low-dose base implant step is preferably followed by a second ion implant that is carried out using the conditions mentioned above.

It is again emphasized that the above types of implant conditions are exemplary and by no way limit the scope of the present invention. Instead, the present invention contemplates all conventional ion implants that are typically employed in conventional SIMOX processes. In a preferred embodiment of the present invention, a low-dose oxygen ion implant step which includes the base ion implant step and the second ion implant step is employed. FIG. 2B shows the hybrid SOI substrate material including upper Si-containing layer 12, buried insulating 22 and second Si-containing layer 14. As shown, a portion of the lower Si-containing layer 14 is located above the surface of the buried insulating region 22.

Figure 3A:
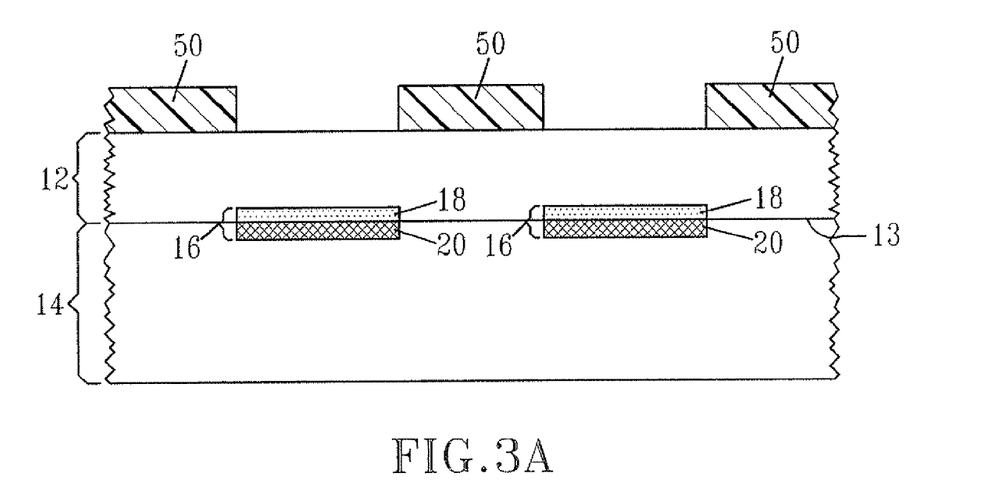
FIGS. 3A-3B are pictorial representations (through cross-sectional views) illustrating the various processing steps of one embodiment of the present invention for fabricating a hybrid SOI substrate, wherein the buried insulating region is non continuous and is present through an interface between the upper and lower Si-containing layers.
Figure 3B:
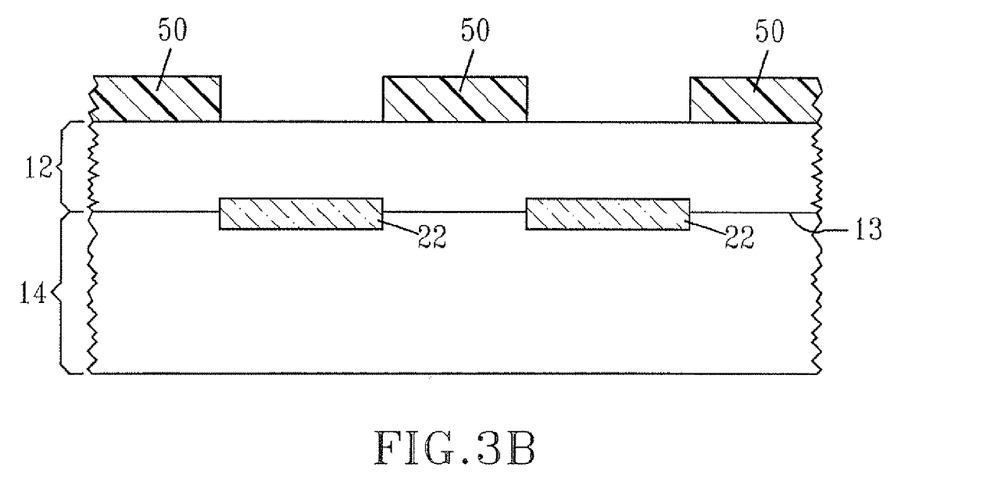
Figure 4A:
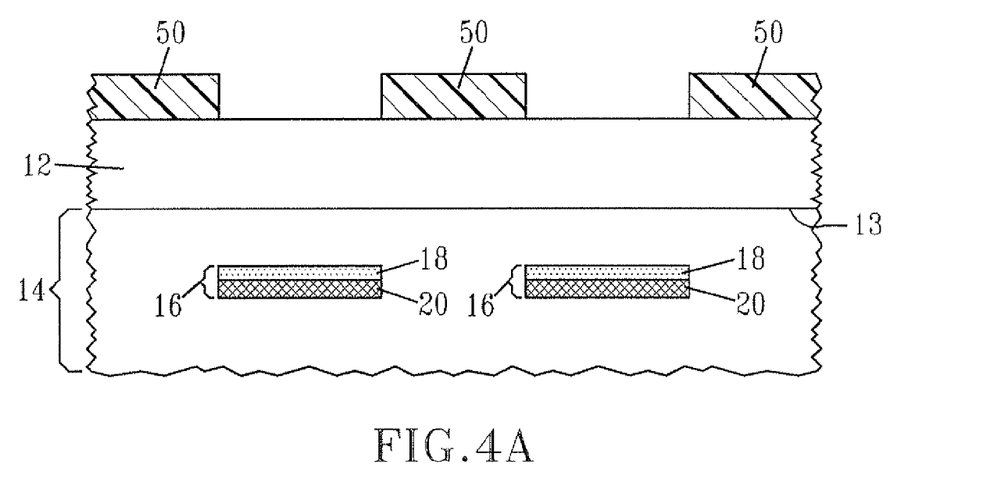
FIGS. 4A-4B are pictorial representations (through cross-sectional views) illustrating the various processing steps of one embodiment of the present invention for fabricating a hybrid SOI substrate, wherein the buried insulating region is non continuous and is present within the lower Si-containing layer.
Figure 4B:
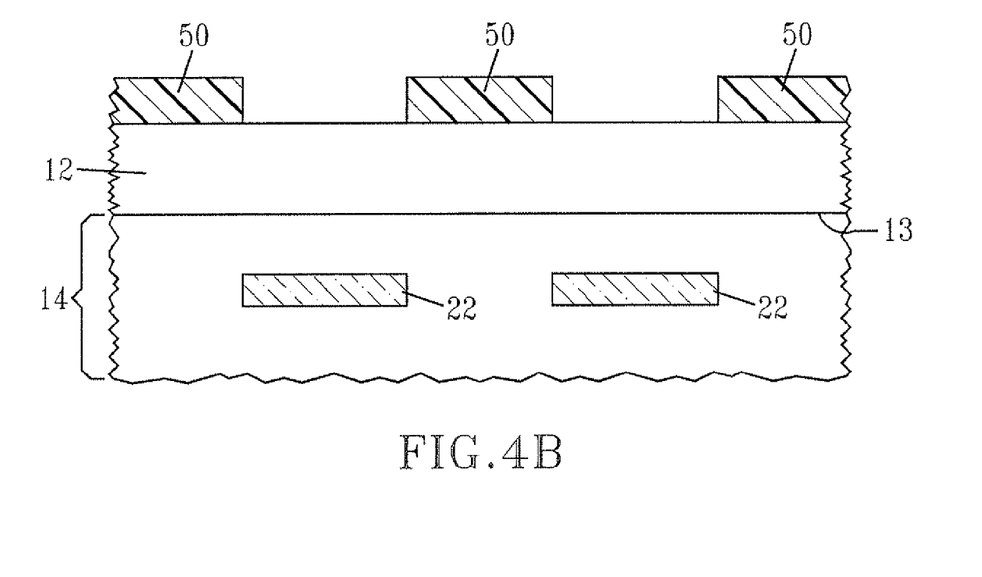
Figure 5A:
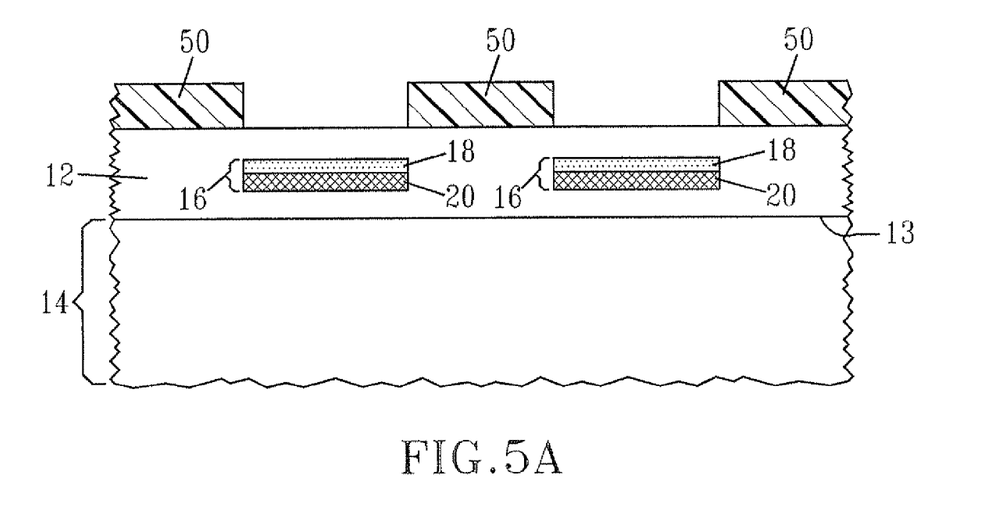
FIGS. 5A-5B are pictorial representations (through cross-sectional views) illustrating the various processing steps of one embodiment of the present invention for fabricating a hybrid SOI substrate, wherein the buried insulating region is non continuous and is present within the upper Si-containing layer.
Figure 5B:
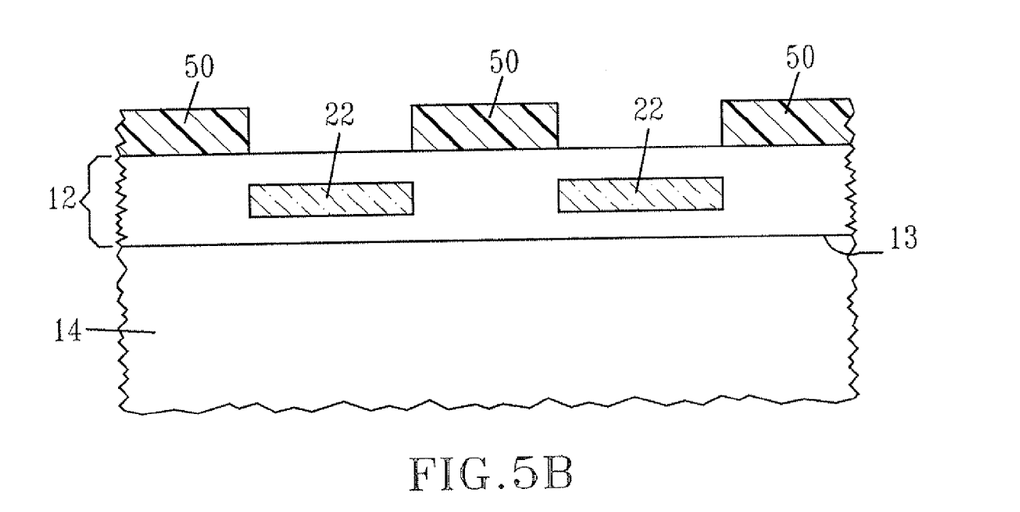

FIG. 3A-3B shows another embodiment in which a non-continuous (i.e., patterned) buried insulating region 22 is formed. The structure shown in the drawings is formed utilizing a mask 50 as shown in FIG. 3A. Although the mask 50 is present on the surface of the upper Si-containing layer 12, it can be moved some distance from the surface without effecting the final hybrid SOI substrate. In this case, buried insulating region 22 is non continuous and is present through an interface 13 located between the upper Si-containing layer 12 and the lower Si-containing layer 14. Although a non continuous buried insulating region 22 is shown, a continuous buried insulating region 22 can be formed at the interface by utilizing a blanket ion implant step.

FIGS. 4A-4B and FIG. 5A-5B shows embodiments in which a non continuous buried insulating region 22 is formed into the lower Si-containing layer 14 and the upper Si-containing layer 12, respectively.

Although not illustrated the above technique can be used to form multiple buried insulating regions (continuous, non continuous or a mixture thereof) into the stack. For example, it is possible to form a continuous buried insulating region into the lower Si-containing layer 14 and then form a non continuous buried insulating region within the upper Si-containing layer 12. Similarly, the above technique can be used to form non continuous buried insulating regions at different locations, different depths and different widths with the stack 10.

In either of the embodiments described above, it is possible to form a strained semiconductor layer such as Si or SiGe atop the upper Si-containing layer. The strained semiconductor layer is formed utilizing a conventional deposition process such as chemical vapor deposition or epitaxy. The strained semiconductor layer may be comprised of a pure isotope, such as, for example, Si$^{28}$.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A hybrid SOI substrate material comprising:
a stack including a first wafer containing an upper Si-containing layer of a first crystallographic orientation and a second wafer containing a lower Si-containing layer of second crystallographic orientation, wherein said first crystallographic orientation is different from said second crystallographic orientation and said upper Si-containing layer of said first wafer extends above an entirety of the lower Si-containing layer of the second wafer;
a buried insulating region located within at least one of the upper Si-containing layer or the lower Si-containing layer or through an interface located between the upper and lower Si-containing layers; and
a strained semiconductor layer located on a surface of said upper Si-containing layer.

2. The hybrid SOI substrate material of claim 1 wherein said lower and upper Si-containing layers comprise the same or different silicon containing semiconductor material selected from the group consisting of Si, SiGe, SiC, SiGeC, performed SOI, performed SiGe-on-insulators and layered structures.

3. The hybrid SOI substrate material of claim 1 wherein said upper and lower Si-containing layers both comprise Si.

4. The hybrid SOI substrate material of claim 1 wherein said first and second crystallographic orientations comprise (100), (111), (100), (422), (311) (521) or any other major or minor axes of a Si-containing material.

5. The hybrid SOI substrate material of claim 1 wherein said buried insulating region is continuous or non continuous.

6. The hybrid SOI substrate material of claim 1 wherein said buried insulating region comprises a buried oxide.

7. The hybrid SOI substrate material of claim 6 wherein said buried oxide is a thermal oxide.

8. The hybrid SOI substrate material of claim 1 wherein said buried insulating region is present within the upper Si-containing layer.

9. The hybrid SOI substrate material of claim 1 wherein said buried insulating region is present within the lower Si-containing layer.

10. The hybrid SOI substrate material of claim 1 wherein said buried insulating region is present through said interface.

11. The hybrid SOI substrate material of claim 8 wherein a portion of said upper Si-containing layer is located beneath said buried insulating region.

12. The hybrid SOI substrate material of claim 9 wherein a portion of said lower Si-containing layer is located above said buried insulating region.

13. The hybrid SOI substrate material of claim 1 wherein at least said upper Si-containing layer is isotopically pure.

14. A hybrid SOI substrate material comprising:
a stack including an upper Si-containing layer of a first crystallographic orientation and a lower Si-containing layer of second crystallographic orientation, wherein said first crystallographic orientation is different from said second crystallographic orientation; and
a buried insulating region located within the lower Si-containing layer.

15. A hybrid SOI substrate material comprising:
a stack including a first wafer containing an upper Si-containing layer of a first crystallographic orientation and a second wafer containing a lower Si-containing layer of second crystallographic orientation, wherein said first crystallographic orientation is different from said second crystallographic orientation and said upper Si-containing layer of said first wafer extends above an entirety of the lower Si-containing layer of the second wafer and wherein at least said upper Si-containing layer is isotopically pure; and a buried insulating region located within at least one of the upper Si-containing layer or the lower Si-containing layer or through an interface located between the upper and lower Si-containing layers.

16. A hybrid SOI substrate material comprising:

a stack including a first wafer containing an upper Si-containing layer of a first crystallographic orientation and a second wafer containing a lower Si-containing layer of second crystallographic orientation, wherein said first crystallographic orientation is different from said second crystallographic orientation and said upper Si-containing layer of said first wafer extends above an entirety of the lower Si-containing layer of the second wafer; and a buried insulating region located within the lower Si-containing layer, wherein a portion of the lower Si-containing is located above the buried insulating region.

* * * * *